United States Patent [19]

Schmitt et al.

[11] Patent Number: 5,046,656

[45] Date of Patent: Sep. 10, 1991

[54] VACUUM DIE ATTACH FOR INTEGRATED CIRCUITS

[75] Inventors: Edward H. Schmitt; David B. Tuckerman, both of Livermore, Calif.

[73] Assignee: Regents of the University of California, Oakland, Calif.

[21] Appl. No.: 243,535

[22] Filed: Sep. 12, 1988

[51] Int. Cl.⁵ .............................................. B23K 1/03
[52] U.S. Cl. .................................. 228/123; 228/221; 357/67
[58] Field of Search ............... 228/122, 124, 123, 194, 228/198; 437/263.12, 220, 222; 357/67

[56] References Cited

U.S. PATENT DOCUMENTS

| | | | |
|---|---|---|---|
| 3,298,093 | 1/1967 | Cohen | 228/123 |
| 3,317,106 | 5/1967 | Dix | 228/44.7 |
| 3,418,709 | 12/1968 | Herlet et al. | 228/123 X |
| 3,651,562 | 3/1972 | Hambleton | 228/123 X |
| 3,785,892 | 1/1974 | Terry et al. | 357/67 |
| 4,810,671 | 3/1989 | Bhattacharyya | 228/123 X |

Primary Examiner—Kenneth J. Ramsey
Attorney, Agent, or Firm—Henry P. Sartorio

[57] ABSTRACT

A thin film eutectic bond for attaching an integrated circuit die to a circuit substrate is formed by coating at least one bonding surface on the die and substrate with an alloying metal, assembling the die and substrate under compression loading, and heating the assembly to an alloying temperature in a vacuum. A very thin bond, 10 microns or less, which is substantially void free, is produced. These bonds have high reliability, good heat and electrical conduction, and high temperature tolerance. The bonds are formed in a vacuum chamber, using a positioning and loading fixture to compression load the die, and an IR lamp or other heat source. For bonding a silicon die to a silicon substrate, a gold silicon alloy bond is used. Multiple dies can be bonded simultaneously. No scrubbing is required.

10 Claims, 1 Drawing Sheet

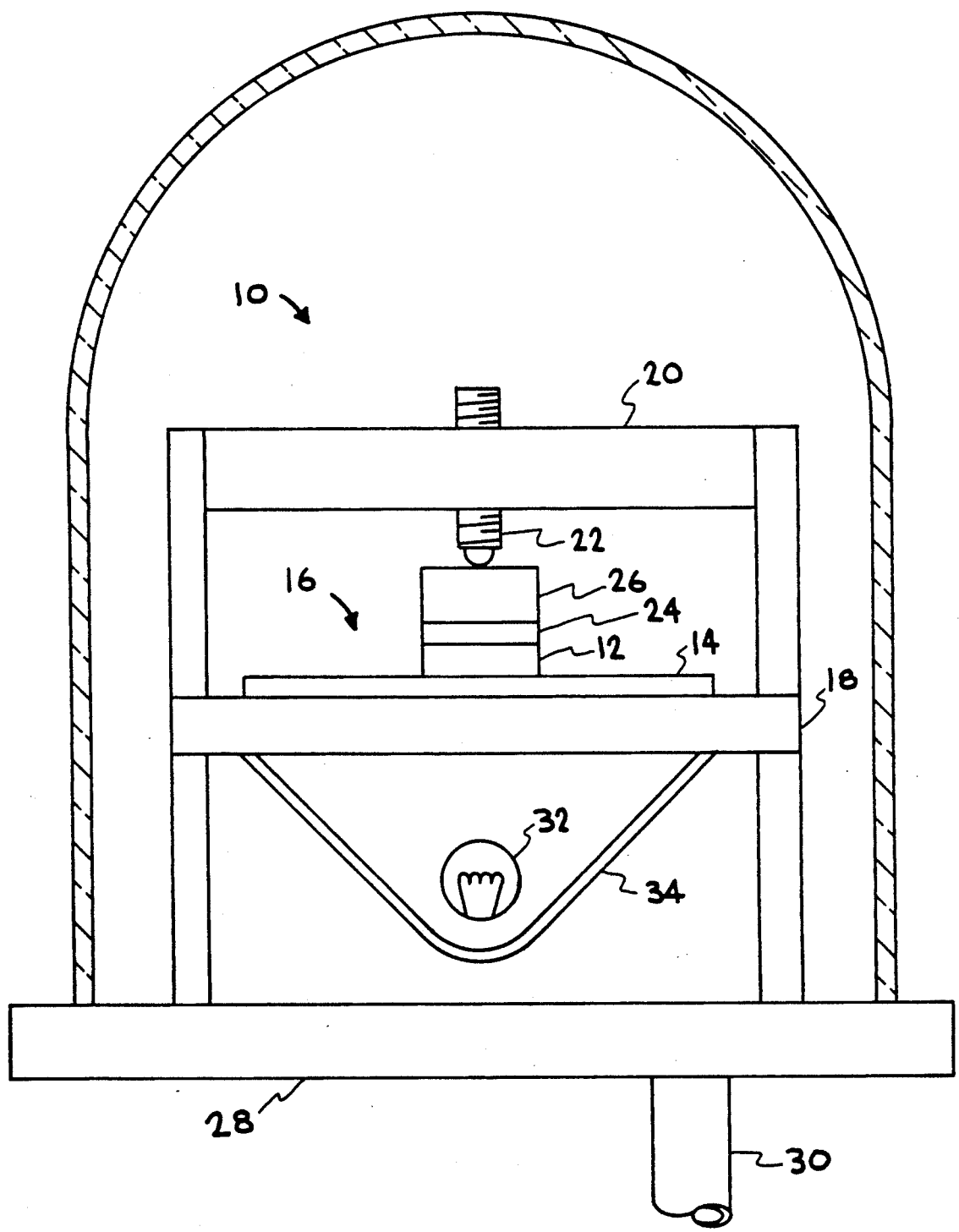

VACUUM DIE ATTACH FOR INTEGRATED CIRCUITS

The U.S. Government has rights to this invention pursuant to Contract No. W-7405-ENG-48 between the U.S. Department of Energy and the University of California, for the operation of Lawrence Livermore National Laboratory.

BACKGROUND OF THE INVENTION

The invention relates generally to integrated circuit fabrication and more particulary to the attachment or bonding of dies (chips) on a circuit substrate.

In the formation of complex electronic integrated circuits (IC's), e.g. hybrid wafer scale integrated (HWSI) circuits, a number of semiconductor integrated circuit chips (dies) are attached or bonded to a substrate. The speed and compactness of the circuit can be seriously affected by the methods used to package and interconnect the integrated circuit chips. After attachment, the chips or dies are electrically interconnected; copending U.S. Pat. application Ser. No. 202,296 filed June 6, 1988, now U.S. Pat. No. 4,992,847, issued Feb. 12, 1991, illustrates thin film chip to substrate interconnects and methods for making same. Thus, the various bonding means and processes used in packaging the electronic circuits form a significant part of the total circuit fabrication process. Unfortunately, the semiconductor chip is subject to considerable handling during these operations, and many problems of both yield and reliability can be traced to inadequate control during these processes.

Microcircuit chips typically range in size from as small as 20×20 mils to as large as 80×200 mils. In a typical conventional die bonding process, these chips are bonded to a gold-plated header (package substrate) by means of a gold-germanium eutectic preform (88% Au-12% Ge by weight). The preform is placed between the header (substrate) and the silicon die. The temperature of the combination is raised to 390°-400° C. and pressure is applied to the die in conjunction with a vibratory scrubbing motion. The scrubbing motion is a back and forth or oscillatory mechanical motion of the silicon die relative to the substrate, typically at 60-120 Hz. Eutectic melting occurs and a Au-Ge-Si bond results upon cooling. A gold-silicon system may also be used in place of the gold-germanium system. After the chips or dies are bonded to the package, leads are attached between chip bonding pads and terminal posts on the package and finally the package itself is sealed.

Eutectic die bonding bonds a die to a substrate using a metal preform (solder) which forms a bonding alloy. Eutectic die bonding metallurgically attaches the die, e.g. a silicon chip, to a metal or ceramic substrate material, typically a metal leadframe made of a Cu or Fe-Ni alloy, or to a ceramic substrate usually 90-99.5% $Al_2O_3$. Metallization is often required on the back of the die (opposite the active circuit side) to make it wettable by the die bonding preform which is a thin sheet, usually less than 0.05 mm, of solder-bonding alloy. The substrate material is usually metallized with plated Ag (leadframes) or Au (leadframes or ceramic). Typical compositions for solder-preform materials include:

| Composition | Temperature (°C.) Liquidus | Solidus |
|---|---|---|
| 80% Au 20% Sn | 280 | 280 |
| 92.5% Pb 2.5% Ag 5% In | 300 | |
| 97.5% Pb 1.5% Ag 1% Sn | 309 | 309 |
| 95% Pb 5% Sn | 314 | 310 |
| 88% Au 12% Ge | 356 | 356 |
| 98% Au 2% Si | 800 | 370 |
| 100% Au | 1063 | 1063 |

Solder die bonding to refractory ceramic packages which are to be hermetically sealed, or to Ni-Fe leadframes is usually performed with a Au or Au-2% Si preform.

Using the Au-2% Si preform to bond a silicon chip, in the presence of mechanical scrubbing and at temperatures above 370° C. (the eutectic temperature), the preform reacts to dissolve the silicon. A Au-3.6% Si eutectic composition is reached and then exceeded. As the composition of the composite structure becomes more Si rich, it freezes and the die bond is completed. Some applications require lower temperature or more ductile die bonding solders to be compatible with other process steps.

The conventional Au-Si eutectic bond is relatively thick, about 25 microns, formed from a gold alloy preform in an atmospheric pressure environment using a scrub operation. The mechanical scrub step in the die bonding process is bad for formation of eutectic bonds since the scrubbing may scrape the bond away, makes it hard to place a chip accurately because of the mechanical motion, limits chip density, and limits the ability to bond multiple chips simultaneously. However, eutectic bonds are very good because of their good heat conduction, high reliability, lack of organics (no outgassing), good electrical conduction, and high temperature tolerance (typically up to about 300° C.). Other materials such as organic materials, silver paste, and epoxies, can alternatively be used to form chip to substrate bonds without requiring a scrubbing operation. However, these bonds do not have all the desirable characteristics of the eutectic bond and are generally not as good.

Thin film eutectic bonds, e.g. 10 microns or less, are highly desirable, particularly for certain high performance circuits. In the chip interconnect process of application Ser. No. 202,296, now U.S. Pat. No. 4,992,847, it is necessary to form a very smooth flush joint at the chip substrate interface which is facilitated by a thin bond. A thin bond can also reduce stress; for example, in a silicon on silicon circuit structure stress is introduced by the bond since it is a different material and has a different coefficient of expansion. A thin bond also provides better heat conduction from chip to substrate.

It is also highly desirable for certain applications to have a void free bond. Void free bonds are useful for high power circuits, and are also advantageous for forming a smooth flush joint for chip interconnect as described in Ser. No. 202,296, now U.S. Pat. No. 4,992,847.

SUMMARY OF THE INVENTION

Accordingly, it is an object of the invention to provide a thin film bond for die attach for integrated circuits.

It is another object of the invention to provide method and apparatus for forming thin film bonds for integrated circuit chips.

It is also an object of the invention to provide thin film bonds of 10 microns or less thickness.

It is a further object of the invention to provide void free bonds.

It is also an object of the invention to produce thin film bonds without a mechanical scrubbing operation.

It is another object of the invention to provide method and apparatus for attaching IC chips to a circuit substrate in which multiple chips can Le placed accurately and bonded simultaneously.

A thin film bond for die attach for integrated circuits is formed by cleaning the die and the substrate surfaces, coating at least one surface with alloying metal, assembling the die and substrate under compression loading, and heating the chip substrate assembly to an alloying temperature in a vacuum environment.

BRIEF DESCRIPTION OF THE DRAWINGS

In the accompanying drawing:

The FIGURE is a cross-sectional view of an apparatus for forming thin film die bonds.

DETAILED DESCRIPTION OF THE PREFERRED EMBODIMENTS

The invention is a method and apparatus for forming thin film eutectic die bonds for die attachment in an integrated circuit structure, and the resulting thin film eutectic bonds and bonded circuit structures formed thereby. In accordance with the invention, the chip (die) and substrate are cleaned and at least one bonding surface is coated with a thin layer of the bonding metal. The die and substrate are assembled under compression loading, placed in a vacuum, and heated to an alloying temperature.

As an illustrative example, a chip wafer which typically contains hundreds of silicon dies, e.g. memory dies, is obtained from a manufacturer or otherwise produced. The chip wafer is cleaned and coated with a thin film, typically about 2 microns, of gold on the back side. Individual chips are then produced by cutting up or dicing the chip wafer into the sizes required. A silicon substrate or superstructure (higher circuit levels formed on a substrate), which may be sealed with oxide, is also manufactured or obtained. The substrate is cleaned and coated with a thin film, typically about 1 micron, of gold. The gold coated surfaces of both the chips and substrate are cleaned with solvents and deionized water, the dies are positioned on the substrate (using an alignment frame for precision positioning, if necessary), and a compression load is applied. The loaded positioned chip-substrate assembly is placed in a chamber which is evacuated to form a good vacuum environment. The assembly is heated to an alloying temperature for a sufficient time to form a eutectic bond by means of a suitable heating means.

The temperature profile of the substrate should be as uniform as possible in order to produce a quality die bond. For the Au-Si eutectic system the temperature window for bonding falls between 390° and 400° C. (the eutectic temperature is 370° C.). The temperature during the heating step should be held within this temperature window; preferably the temperature is held at 395°±1° C.

In operation the die substrate assembly is heated to 395° C. from room temperature in about 3–4 minutes. As soon as a temperature of 395° C. is reached, the heat source is shut off. When the temperature drops to 350° C. (eutectic temperature is 370° C.) the evacuated chamber is filled with nitrogen and the bonded chip substrate structure is removed.

The vacuum quality is also very important to provide good die bonds in order to lessen the amount of oxidation during bonding (since Si oxidizes easily). The resulting lack of oxygen during bonding allows the die attach process to remove the scrubbing step required in conventional die bonding. The vacuum also results in substantially void free bonds. An inert gas environment would prevent oxidation but would not produce void free bonds. Therefore, a vacuum of $10^{-5}$ torr or better is preferred.

This vacuum die bonding process with no scrubbing step provides significant advantages. It allows the bonding of multiple dies at the same time thereby reducing total fabrication time and also reducing the amount of time components are at high temperatures (since all components are exposed to only a single heating step). The process also produces more uniform bonds since they are all produced simultaneously under The same conditions, and because the scrubbing step is not required, the process allows much more densely packaged parts.

Loading of the die is required during the bonding process to enhance thermal conduction. A constant force is maintained on the die during the temperature cycle. Typically 10–13 pounds of force is applied.

An apparatus 10 for forming thin film bonds for die attach is illustrated in the FIGURE. A die 12 is placed on substrate 14 using appropriate positioning means, forming chip-substrate assembly 16. Die 12 and substrate 14 have been processed as described so that at least one contacting surface is coated with a thin gold film. Substrate 14 is placed on substrate holder 18. Die 12 is compression loaded against substrate 14 by means of loading fixture 20 which includes spring loaded set screws 22 which maintain a constant force on die 12 through an elastomer 24 which is placed on the top surface of die 12 and a stainless steel block 26 which is placed over elastomer 24. The die substrate assembly 16 on substrate holder 18 with loading fixture 20 is placed in vacuum chamber 28 which is evacuated to the appropriate vacuum pressure through vacuum inlet/outlet 30. The die substrate assembly is heated by an infrared lamp 32 which is positioned below substrate holder 18. An infrared reflector 34 surrounds infrared lamp 32 to uniformly heat substrate holder 18. Substrate 14 is mounted on substrate holder 18 in good thermal contact so that uniform heating of the substrate and die occur.

Using the process and apparatus described herein with a silicon die, silicon substrate and gold metal, a high quality Au-Si (about 2.5%) eutectic bond is formed. The bond is a very thin film bond, typically less than 10 microns, and is substantially void free. No additional source of silicon is required for the alloying process since the die itself provides sufficient silicon for alloying. An integrated circuit structure is produced having dies or chips attached to a substrate or other circuit structure by means of thin film eutectic bonds. The circuit is then completed by forming electrical interconnects between the chips and substrate, e.g. by the processes of copending application Ser. No. 202,296 filed June 6, 1988, now U.S. Pat. No. 4,992,487, issued Feb. 12, 1991, which is herein incorporated by reference. The bond itself and the bonded integrated circuit structure also form a part of the invention.

Although the invention has been described primarily with reference to silicon chips and substrates and the Au-Si eutectic alloy, the invention is applicable to all eutectic alloys, including Au-Ti, Au-Ge, and Pb-In-Ti types. The chip and substrate are treated as previously described; the surfaces are coated with the appropriate metal, the assembly is placed in a vacuum chamber under compression loading, and the assembly is heated to the appropriate alloying temperature for the particular eutectic alloy being utilized. However, presently the major interest is in gold and silver alloys for semiconductors.

Changes and modifications in The specifically described embodiments can be carried out without departing from the scope of the invention which is intended to be limited only by the scope of the appended claims.

We claim:

1. A method for forming a thin film eutectic bond between a silicon integrated circuit die and a circuit substrate, comprising:
   coating a bonding surface of the die with a gold layer of about 2 microns thickness and coating the substrate with a gold layer of about 1 micron thickness;
   positioning the die on the substrate after coating with gold to form a die-substrate assembly;
   compression loading the die against the substrate in the die-substrate assembly;
   forming a vacuum surrounding the die-substrate assembly;
   heating the die-substrate assembly to an alloying temperature.

2. The method of claim 1 comprising heating to a temperature of about 390°–400° C.

3. The method of claim 2 comprising heating to about 395° C.

4. The method of claim 3 comprising heating for about 3–4 min.

5. The method of claim 1 comprising forming a vacuum of about $10^{-5}$ torr or less.

6. The method of claim 1 comprising compression loading the die with a force of about 10–13 lbs.

7. The method of claim 1 further comprising bonding multiple dies simultaneously.

8. An integrated circuit structure, comprising:
   a circuit substrate;
   at least one integrated circuit die mounted on the substrate;
   a thin film eutectic vacuum bond having a thickness of about 10 microns or less formed between the at least one die and the substrate;
   circuit interconnect means which electrically connect the at least one die to the substrate.

9. The circuit structure of claim 8 wherein the at least one die and substrate are formed of silicon, and the thin film bond is formed of gold-silicon alloy.

10. The circuit structure of claim 8 wherein the bond is formed by coating at least one bonding surface on the at least one die and substrate with a thin film of alloying metal, compression loading the at least one die to the substrate after coating, and heating the die and substrate to an alloying temperature in vacuum.

* * * * *